United States Patent [19]

Orcutt

[11] Patent Number: 4,504,435
[45] Date of Patent: Mar. 12, 1985

[54] METHOD FOR SEMICONDUCTOR DEVICE PACKAGING

[75] Inventor: John W. Orcutt, Garland, Tex.

[73] Assignee: Texas Instruments Incorporated, Dallas, Tex.

[21] Appl. No.: 432,594

[22] Filed: Oct. 4, 1982

[51] Int. Cl.³ .............................................. B29C 6/04
[52] U.S. Cl. ................................ 264/272.17; 29/588; 264/161; 264/328.5; 264/328.9
[58] Field of Search ............ 264/272.17, 328.4, 328.5, 264/328.9, 161; 425/116, 121, 127, 544; 29/588

[56] References Cited

U.S. PATENT DOCUMENTS

| 4,003,544 | 1/1977 | Bliven et al. | 425/121 |
|---|---|---|---|
| 4,043,027 | 8/1977 | Birchler et al. | 264/272.17 |
| 4,332,537 | 1/1982 | Slepcevic | 425/121 |

FOREIGN PATENT DOCUMENTS

| 2900114 | 2/1980 | Fed. Rep. of Germany | 264/272.17 |
|---|---|---|---|
| 52-43366 | 4/1977 | Japan | 264/272.17 |
| 53-33260 | 3/1978 | Japan | 425/121 |
| 56-43854 | 10/1981 | Japan | 264/272.17 |
| 57-75434 | 5/1982 | Japan | 29/588 |

*Primary Examiner*—James Lowe
*Attorney, Agent, or Firm*—Richard A. Bachand; N. Rhys Merrett; Melvin Sharp

[57] ABSTRACT

A method and apparatus for encapsulating a lead frame in a flat metal strip and a semiconductor device attached thereto having a mold receiving the semiconductor device and lead frame into a cavity. The strip has a thoroughfare over a solid surface to adjacent said lead frame. A depression in the mold over a portion of the thoroughfare contains a pellet of plastic. A runner extends from the depression over the thoroughfare to transfer liquid plastic from the depression into the cavity.

4 Claims, 8 Drawing Figures

METHOD FOR SEMICONDUCTOR DEVICE PACKAGING

BACKGROUND OF THE INVENTION

1. Field of the Invention

The invention relates to the packaging of semiconductor devices and, more particularly, the invention relates to the packaging of lead frames and semiconductor devices by plastic encapsulation.

2. Description of the Prior Art

It is known to encapsulate semiconductor devices, for example, Integrated Circuits, with plastic as shown in U.S. Pat. No. 4,043,027 issued to Birchler et al on Aug. 23, 1977 and entitled "Process for Encapsulating Electronic Components in Plastic". The semiconductor devices are first attached to the bar pad of a lead frame. Contact pads on the semiconductor device are then individually attached by wire bonding, for example ball bonding, to corresponding contact pads on the ends of leads of the lead frame adjacent to but spaced from the bar pad. The attachment of the semiconductor device can be by any standard technique for example by alloying the surface of the semiconductor away from the surface having the active circuits located thereon to a surface of the bar pad.

The lead frame which can be attached to a plurality of other similar lead frames is then placed in a mold. The mold is provided with a cull or reservoir containing a quantity of raw plastic. A network of runners or channels extend from the cull to one or more cavities containing the semiconductor devices. The path of the plastic from the cull to cavity may extend through one or more cavities. In general, a gate or constriction is provided in the runner immediately prior to the cavity. The lead frame is seated in a chase or depression in the mold. The mold is generally constructed in two parts. The lead frame is seated into a chase in one part of the mold utilizing alignment stubs extending from the chase. The alignment stubs have corresponding alignment holes in lead frame to insure that the lead frame is properly seated into the chase. The other part of the mold is then brought into contact with the part having the lead frame seated therein. When properly aligned the semiconductor device is located in a cavity formed by depressions in both parts of the mold. The cavity is connected by a runner to the cull of the mold. Pressure is then applied to the plastic in the cull and forced under pressure through the runners into the cavity. The plastic encloses the semiconductor device, the bar pad of the lead frame, and the ends of the leads of the lead frame adjacent to the semiconductor device. The entire length of the wires individually connecting the contact pads of the semiconductor device and the contact pads on the ends of the leads of the lead frame adjacent to the semiconductor device are also enclosed. However, it should be noted that portions of the leads of the lead frame including the ends of the lead frame away from the semiconductor device are clamped between the two parts of the mold and are therefore outside the cavity. The portion of the lead frame outside the cavity is not enclosed by plastic. Heat is applied to the mold to cure the plastic to sufficient hardness. The mold is then opened and the lead frame removed. The operation is then repeated.

It has been found useful to form the lead frames in a strip. Each lead frame of a strip has a semiconductor device attached to its bar pad as discussed above. The bar pads are connected through supports to two parallel side rails. Each side rail is located in the plane of the lead frame and on opposite sides of the bar pad. The leads of each lead frame are formed into two sets extending generally parallel to the side rails from adjacent opposite sides of the bar pad. The leads of each lead frame are connected to the leads of at least one adjacent lead frame. Typically when the strip is placed into the chase of a mold, at least one other strip is placed into another similar chase of the mold. It is also known in the art to supply plastic to a cavity through another cavity. In the system, two lead frames are formed laterally adjacent between the side rails. The cavity of the lead frame adjacent the runner is connected to the cavity of the lead frame away from the runner.

The lead frames are constructed from a flat metal sheet by an etch technique or by a punch operation. After the encapsulated semiconductor device and lead frame are removed from the mold, they are generally placed in an oven for the application of heat to further cure the plastic. The individual leads are then separated. The leads are usually connected together to provide additional mechanical support during the assembly process and to provide a dam to prevent plastic from leaving the cavity between the leads. The support between the leads is outside the plastic encapsulating the semiconductor device and a portion of the lead frame. The separation of the leads is generally referred to as a trim operation. If the leads are in a strip, the leads are then severed from the leads of the adjacent lead frames. The side rails are also separated from the leads and from the supports attached to the bar pad within the encapsulating plastic. An unique electrical connection has now been formed between the contact pads on the semiconductor device and the ends of the lead frame located outside the encapsulating plastic for the connection of the semiconductor device with other circuitry. For example, an electrical connection is formed from one contact pad on the semiconductor device through the wire attached thereto and the contact pad on the end of an adjacent lead to the end of the lead outside the encapsulating plastic.

None of the prior constructions shows encapsulating a lead frame and semiconductor device utilizing a strip of lead frames wherein the a plastic pellet is placed on a solid portion of the strip which acts as one part of the mold, when the two parts of the mold are brought into close contact with the lead frame there between supported by one part of the mold with the other part of the mold forcing the plastic against the lead frame, for the distribution of the plastic to at least one cavity having a semiconductor device and a portion of its associated lead frame located therein.

SUMMARY OF THE INVENTION

The apparatus of the present invention includes a flat sheet of metal, which can be, for example, of stainless steel. The metal sheet is either punched, etched, or by some other operation formed into a strip having a plurality of lead frames. Each lead frame has a bar pad and a plurality of leads. Openings separate the bar pad from the ends of the leads adjacent thereto. The bar pad is attached to two supports. The supports extend from opposite sides of the lead frame to the major portion of the strip. The leads extend from at least one side of the rectangular bar pad perpendicular to the sides from which the supports extend to another opposite end of the lead away from the end adjacent to the bar pad. The ends of the leads away from the bar pad can be connected to the major portion of the strip or to the leads of another adjacent lead frame. Since the strip and the lead frames it includes are formed from a flat metal sheet, the leads, the bar pad, and the major portion of the strip are substantially in the same plane. The major portion of the strip includes thoroughfares over a solid surface of the strip which extend adjacent at least one of the lead frames parallel to the leads and perpendicular to the supports connecting the bar pads to the major portion. The outer part of the major portion of the strip along its longitudinal sides forms two side rails. The side rails are provided with various indexing and alignment holes to provide a convenient area to motivate the strip and to insure proper alignment of the strip during the assembly process.

Semiconductor devices, which can be, for example integrated circuits, are attached to one surface of the bar pad. The semiconductor device can be attached by any standard technique, for example, by alloying. The surface of the semiconductor device away from the surface thereof attached to the bar pad has a plurality of contact pads thereon. The contact pads represent the input/output and power connections for the circuitry on the semiconductor device. At least some of the contact pads are connected to contact pads located on the ends of the leads adjacent the bar pads. In some cases not all of the contact pads are connected to the leads and not all of the leads are connected to a contact pad of the semiconductor device. The connections between the contact pads of the semiconductor device and the contact pads of the lead frame can be by wires. The wires can be attached by any standard technique for example ball bonding. The wires are very thin and relatively weak. Further, the bonds between the wires and the contact pads are mechanically weak. Therefore, it is desirable not to apply stress to this region. For this reason, semiconductor device manufacturers have found it necessary to enclose this region. One way of providing the necessary isolation is to encapsulate the region in plastic. The plastic encapsulation is accomplished by placing the lead frame in a mold.

The mold includes generally two parts. One part has a chase or shallow depression which aligns the strip. The face of the strip which includes the surface of the bar pads having the semiconductor can be located toward this part of the mold. The chase includes depressions. When the lead frames are properly aligned the central portion of the lead frame which includes the bar pad and a portion of the end of each lead adjacent the end thereof next to the bar pad are located over a depression. The depression is of sufficient depth that its bottom is well spaced from the wires and the surface of the semiconductor device opposite to the surface thereof attached to the bar pad. During an encapsulating operation, the other part of the mold is brought into close rigid contact with the part of the mold having the chase. The two parts of the mold have pressure applied thereto to maintain them in close contact. The second part of the mold has depressions which are similar to those in the first part. The depressions in the first and second parts of the mold cooperate to form a cavity about the semiconductor device, the bar pad, wires, and the ends of the leads adjacent the bar pad. The major portion of the strip including the side rails is in contact with both parts of the mold. The portion of each lead outside the cavity is in contact with both parts of the mold. The lateral support, if any, between the leads is also in contact with both parts of the mold. The second part of the mold also has at least one runner or opening extending from a depression having a pellet of plastic located therein. The plastic can be placed on the surface of the strip at the proper site to insure location of the pellet in the depression when the lead frame is properly aligned within the mold. A runner in the part of the mold having the depression located therein extends from the depression to the cavity formed by the mold about the semiconductor device, the bar pad, and the portion of the lead frame adjacent the bar pad.

During an encapsulating operation the plastic pellet in the depression is subjected to pressure which causes the plastic to flow down the runner over the surface of the strip (along the thoroughfare) into the cavity. Heat is then applied to partially cure the plastic. The mold is then opened and the strip removed. The mold is ready for the next strip and the operation is repeated.

It is an advantage of the present invention to provide a strip of lead frames and a mold which allows a portion of the lead frame to act as a part of the mold to allow plastic to pass thereacross.

It is another advantage of the present invention to provide increased production by locating a pellet of plastic in a depression in one part of a mold and applying pressure when the parts of the mold are in contact with a strip of lead frames therebetween to force the plastic to flow along a runner in the part of the mold having the depression therein over the surface of the strip to a cavity containing the semiconductor device.

It is also an advantage of the present invention to provide a strip of lead frames which has no flash over point.

An additional advantage of the present invention is to provide an encapsulating process having reduced cost.

A further advantage of the present invention is to provide an an encapsulating process which does not leave plastic scrap in the mold.

It is a further advantage of the present invention to provide an encapsulating process wherein the plastic scrap is carried out of the mold attached to the strip of lead frames.

DESCRIPTION OF THE PREFERRED EMBODIMENT

Figure 1:
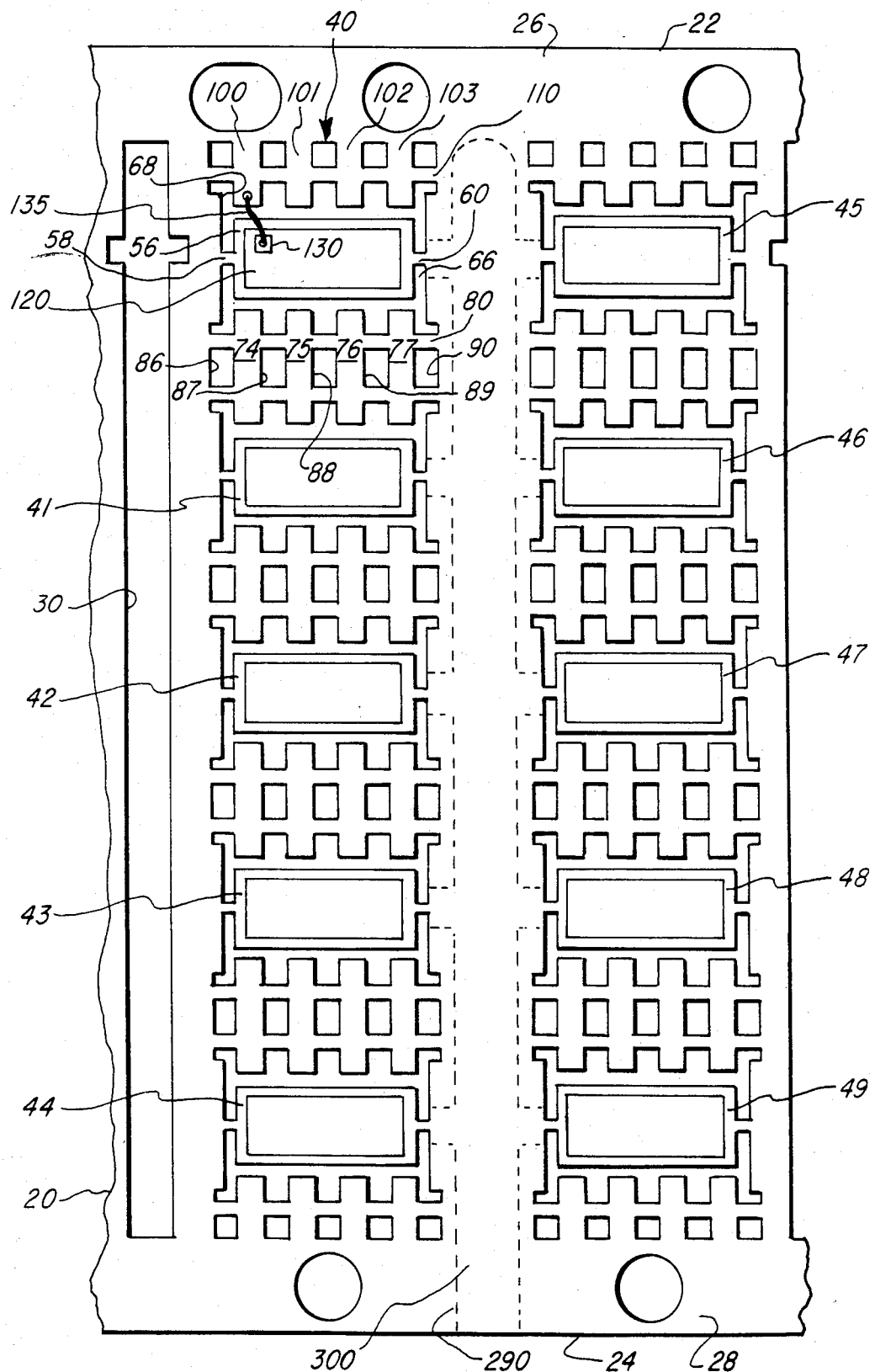
FIG. 1 is a top view of a strip of lead frames.

With reference to the drawings and in particular to FIG. 1 thereof, a strip 20 is shown. Strip 20 is constructed from a flat sheet of metal for example stainless steel. The metal sheet has been etched or punched to produce the strip 20. Strip 20 has two longitudinal sides 22 and 24. The portions of strip 20 adjacent to longitudinal sides 22 and 24 form side rails 26 and 28, respectively. An opening 30 in strip 20 separates portions of the strip 20 which are connected only by side rails 26 and 28. Lead frames 40–49 are provided in strip 20. The other portions of strip 20 (not shown in FIG. 1) can be provided with other lead frames. Although ten lead frames are shown in FIG. 1 any convenient number can be provided. The lead frames 40–49 are similar and a detailed discussion of lead frame 40 shall suffice for all. Bar pad 56 has has a rectangular shape and is connected to lead frame 40 and therefore the major portion of strip 20 by supports 58 and 60. Lead frame 40 has openings 66 and 68. Opening 66 extends between bar pad 56, supports 58 and 60, and leads 74–77. Leads 74–77 extend from adjacent a side of bar pad 56 which is perpendicular to the sides having supports 58 and 60 attached thereto. The leads extend from their ends adjacent to bar pad 56 to other opposite ends away from bar pad 56. The leads 74–77 extend basically parallel. A lateral support 80 extends from the major portion of strip 20 across leads 74–77 to provide additional mechanical support during the assembly process and to act as a dam during encapsulation. Opening 66 is also bounded by lateral support 80. The smaller openings 86–90 extend between leads 74–77 and the lateral support 80. The end of leads 74–77 away from bar pad 56 are attached to the major portion of strip 20. Another set of leads 100–103 similar to leads 74–77 extends from ends adjacent a side of bar pad 56 away from the side of bar pad 56 to which an end of leads 74–77 is adjacent. A lateral support 110 is provided across leads 100–103 and is similar to lateral support 80. A semiconductor device 120 is attached to a flat surface of bar pad 56. The semiconductor device 120 has a plurality of contact pads (only contact pad 130 is shown) which are connected by wires (only wire 135 is shown) to the ends of the leads 74–77 and 100–103 (only the contact pad on the end of lead 100 is shown connected through wire 135 to contact pad 130 of semiconductor device 120). The connection of wire 135 can be by any standard technique, for example ball bonding. Although eight leads are shown in FIG. 1, any number of leads can be utilized with the present invention.

Figure 2:
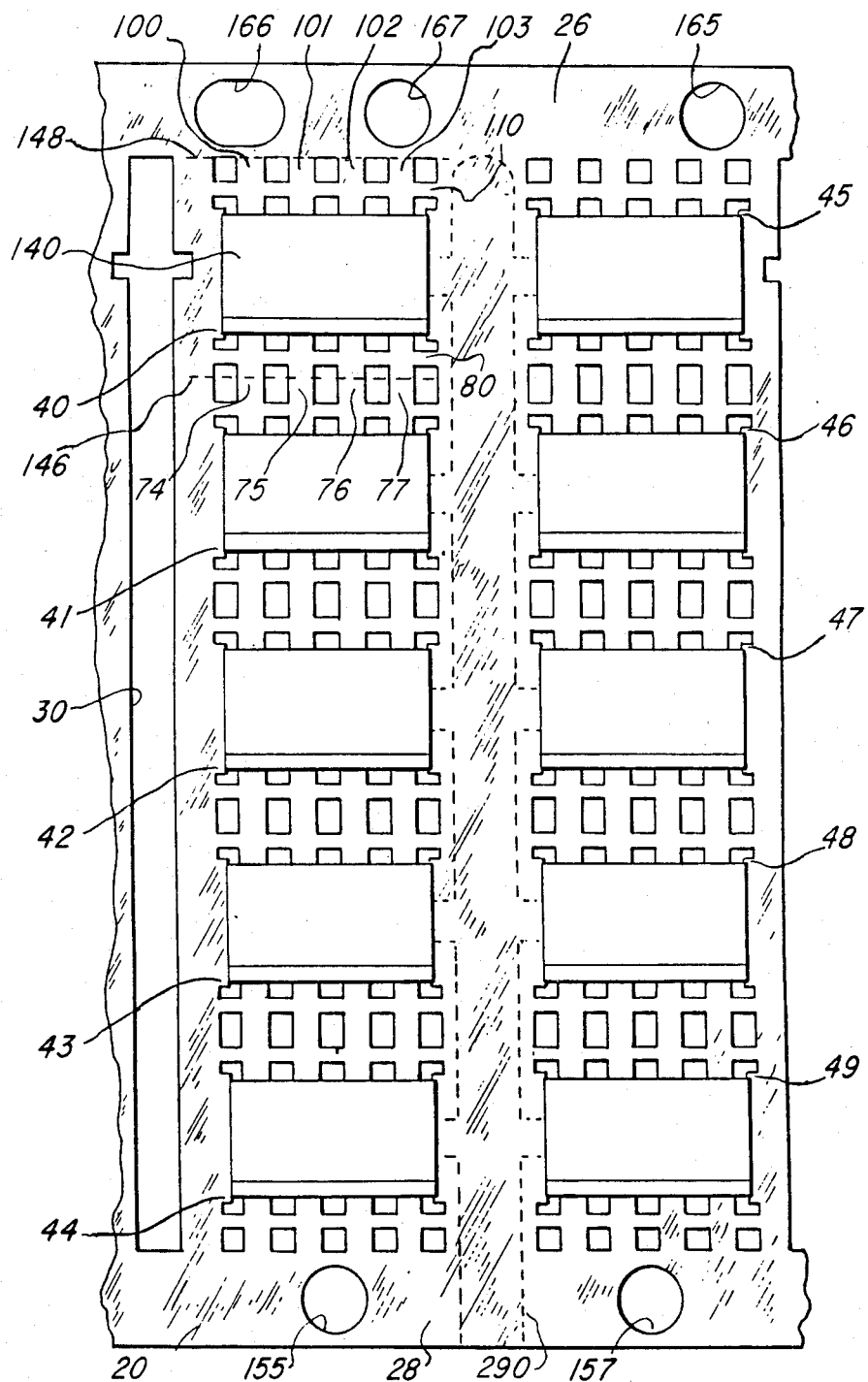
FIG. 2 is a top view of the strip of lead frames of FIG. 1 after encapsulation.

As shown in FIG. 2, lead frame 40 is encapsulated with plastic forming an enclosure 140. Within the enclosure 140 is semiconductor device 120, bar pad 56, supports 58 and 60, and the ends of leads 74–77 and 100–103 adjacent to bar pad 56 (FIG. 1). Enclosure 140 protects the wire bonding and semiconductor device from contact. When desired, leads 74–77 and 100–103 are severed along dotted lines 146 and 148, respectively, and the lateral supports 80 and 110 are severed between the leads to produce isolated electrical connections between the leads and the contact pads on the semiconductor device 120. Thus, electrical connection between the semiconductor device 120 and other circuitry is possible. The other lead frames 41–49 are encapsulated in a similar manner.

Holes 155 and 157 are shown in side rail 28. Holes 165–167 are shown in side rail 26. Holes 155 and 165, and 157 and 167 are located at similar locations. However an additional hole 166 is provided in side rail 26 to prevent upside down insertion of the strip 20. The holes 155, 157, and 165–167 provide alignment information and allow easy indexing of the strip 20.

Figure 3:
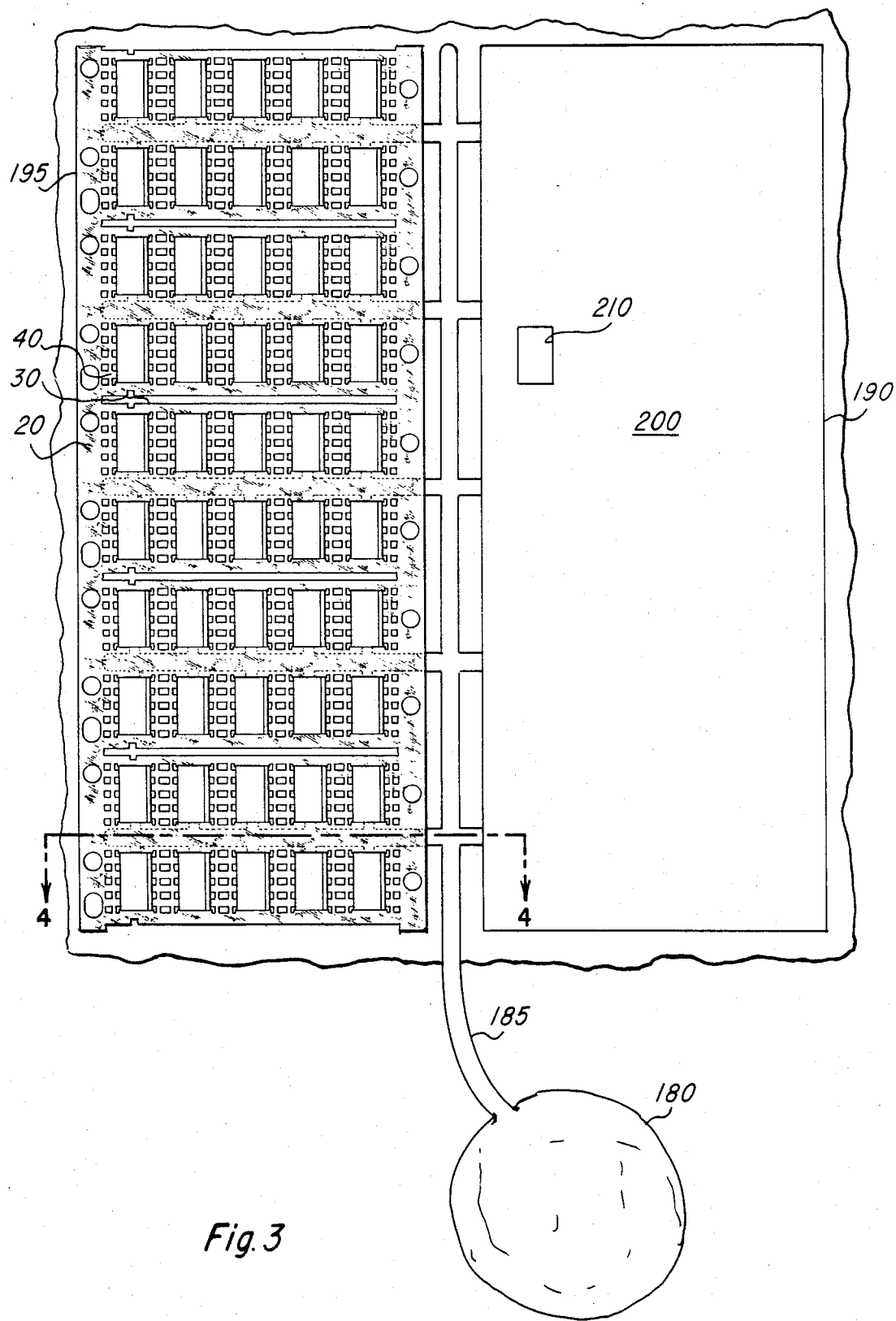
FIG. 3 is top view of a plastic encapsulation apparatus.

As shown in FIG. 3, strip 20 has a number of openings similar to opening 30. The area between openings is similar to the area including lead frames 40–49 (FIG. 1, only lead frame 40 shown in FIG. 3). A cull 180 has a supply of plastic material therein. The cull 180 is connected through a runner 185 into a mold 190. The mold 190 has strip 20 therein. The strip 20 is located in a chase 195, which is similar to chase 200. Chase 200 is adapted to receive a strip (not labeled) which is similar to strip 20. A plurality of depressions in chase 200 (only depression 210 is shown) are located for the semiconductor devices, the bonding wires, and the portion of the leads adjacent the bar pad to be disposed therein. The depression is sufficiently deep to prevent contact with the wires or the semiconductor device. In fact the depth of the depression is approximately half of the desired height of the enclosure. The chase 200 is itself a shallow depression adapted to receive a strip of lead frames similar to strip 20 is close fit. The other part of mold 190 is provided with depressions corresponding to for example depression 210 in chase 200. The combination of the two depressions when the mold 190 is closed is create a cavity having the shape and volume of enclosure 140 (FIG. 2). When pressure is applied to the plastic in cull 180, it flows down runner 185 and into subrunners until it reaches the cavities where the semiconductor devices are located. U.S. Pat. No. 4,043,027 issued to Birchler et al on Aug. 23, 1977 and entitled "Process for Encapsulating Electronic Components in Plastic", which is incorporated by reference hereinto, discusses general molding techniques.

Figure 4:
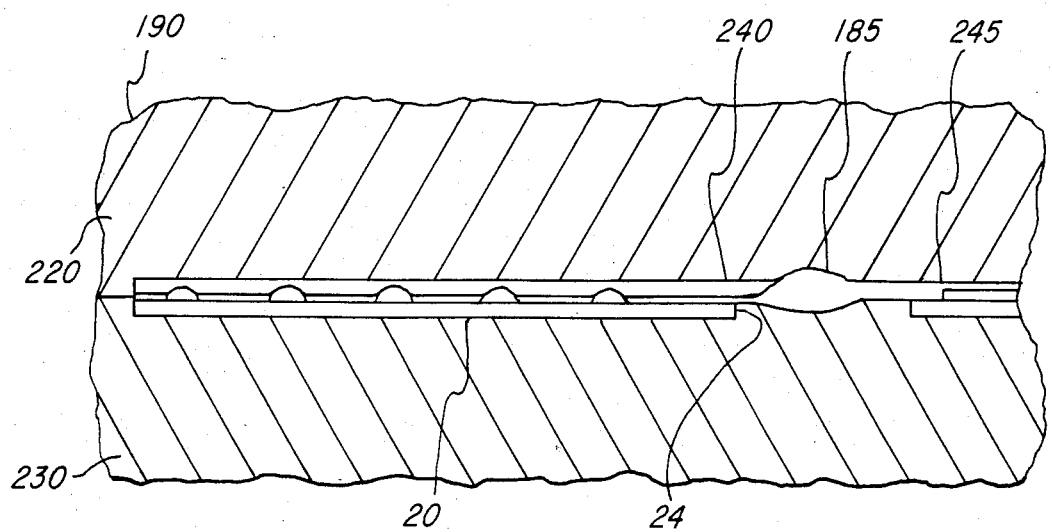
FIG. 4 is cross-sectional view taken along line 4—4 of FIG. 3.

As shown in FIG. 4, the mold 190 has an upper part 220 and a lower part 230. The subrunners 240 and 245 branch off perpendicularly from runner 185. Subrunners 240 and 245 each feed five runners which connect the subrunners to the cavities where the semiconductor devices are located. It should be noted that the upper part 220 and the lower part 230 of mold 190 are held in close contact by pressure. It should be noted that the subrunner 245 only passes over the side 24 of strip 20 once. Thus only one discontinuity is presented to the flow of plastic along subrunner 245 and that is at the passage over side 24. This eliminates a major cause of contamination of the mold 190 from plastic not being firmly connected to the strip and breaking off in the mold.

Figure 5:
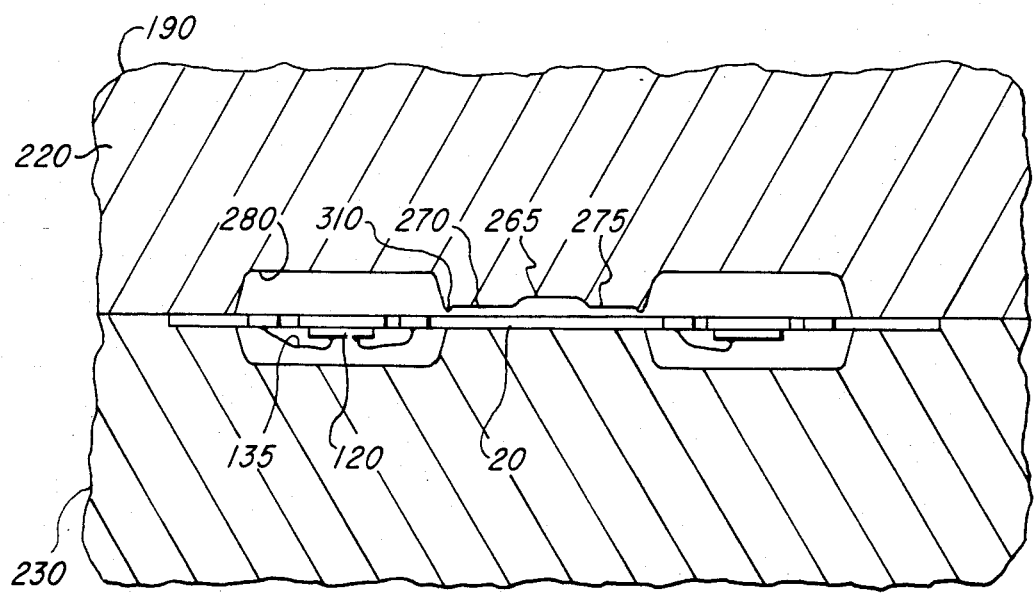
FIG. 5 is a side view of a strip of lead frames within a mold.

As shown in FIG. 5, a subrunner 265 branches off into runners 270 and 275. Runner 270 leads into the cavity 280 formed between parts 220 and 230 of mold 190. The plastic flows through runner 270 and into cavity 280. The lower portion of the cavity is filled by the plastic flowing through the openings 66, and 68 (FIG. 1). The location of subrunner 265 is shown in FIG. 1 by dotted line 290. A thoroughfare 300 (FIG. 1) between the rows of lead frames with one row formed by lead frames 40–44 and another row formed by lead frames 45–49 allows the plastic to pass over one surface of the strip until it reaches a cavity. A gate 310 is provided to allow easy separation of the enclosure 140 (FIG. 2) and from the plastic filling runner 270 after the mold (FIG. 5) is opened and the plastic cured.

Figure 6:
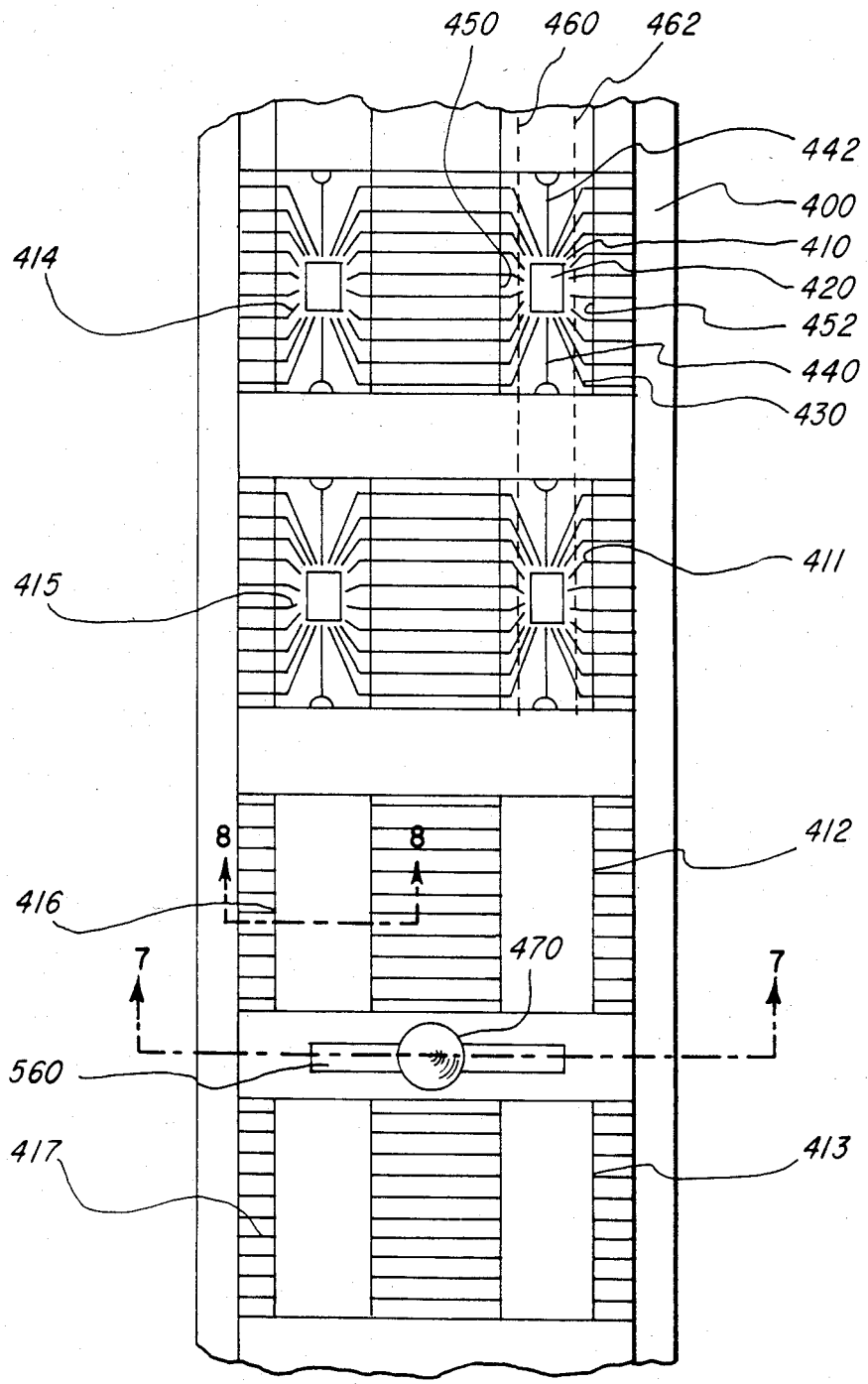
FIG. 6 is a top view of another strip of lead frames constructed according to the present invention.

In accordance with another embodiment of the invention, a strip 400 is shown in FIG. 6. Strip 400 has a plurality of lead frames 410–417. Each of the lead frames is similar and a detail discussion of lead frame 410 shall suffice for all. It should be noted that lead frames 412, 413, 416, and 417 are encapsulated in plastic. Lead frame 410 has a bar pad 420 a plurality of leads 430 with openings between through which plastic flows during the encapsulating process. The leads extend from an end adjacent to bar pad 420 to another opposite end. Supports 440 and 442 extend perpendicularly from sides of bar pad 420. The supports 440 and 442 maintain bar pad 420 in stable relationship with the remainder of lead frame 410. The supports extend across openings 450 and 452. The leads 430 also extend across openings 450 and 452. The leads are divided into two set which extend from opposite sides of the bar pad. The remainder of the strip is solid except for any indexing or alignment holes if any. If it is desired to coat the lead ends adjacent to the bar pad with for example silver or aluminum it possible to do so by moving the strip 400 in its longitudinal direction (vertically as shown in FIG. 6). The coating can then be applied between the dotted lines 460 and 462 onto lead frames 410, 411 etc. The same operation can be performed for lead frames on the side of strip 400 including lead frames 414 and 415.

Figure 7:
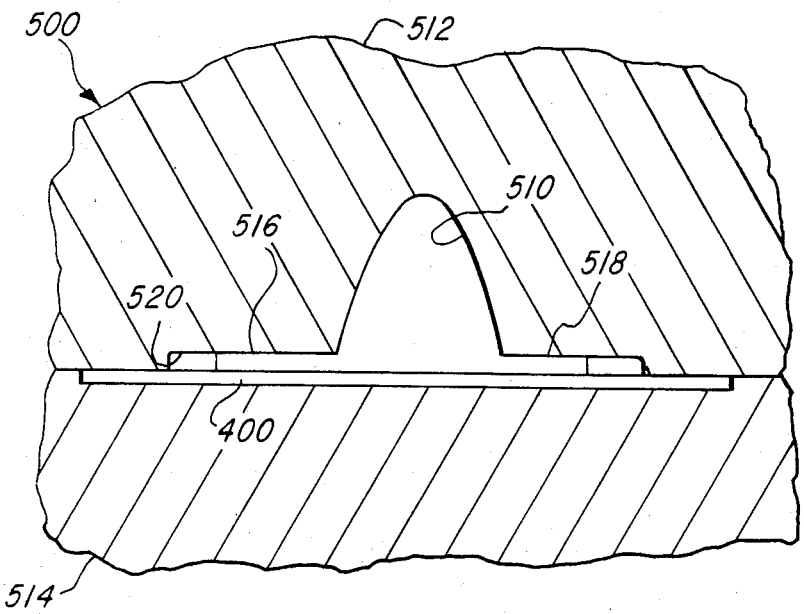
FIG. 7 is a side view of the runners in a mold used with the strip of leads shown in FIG. 6.
Figure 8:
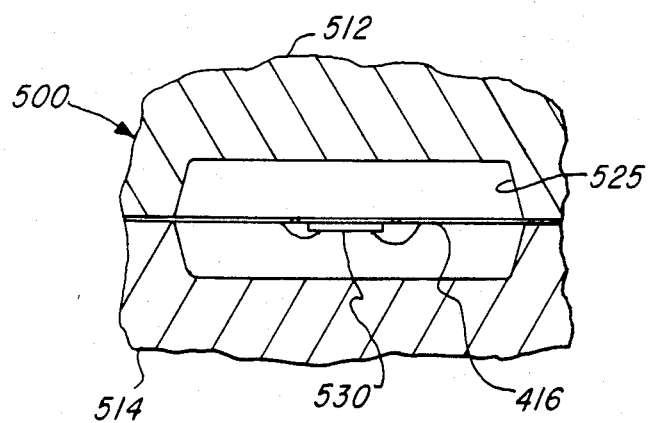
FIG. 8 is a side view of a cavity formed about a portion of one of the lead frames of the strip shown in FIG. 6.

During an encapsulating operation, a plastic pellet is placed at a central location 470 between four lead frames 412, 413, 416, and 417 on the upper surface of strip 400. The portion of strip 400 including lead frames 412, 413, 416, and 417 and the pellet are placed in a mold 500. The mold 500 as shown in FIGS. 7 and 8 has a depression 510 in its upper part 512. The depression 510 is adapted to receive the pellet of plastic. When the two parts 512 and 514 of the mold 500 are brought together under pressure the plastic flows out of depression 510 and along runners 516 and 518. From runner 516 the plastic flows through runner 520 to a cavity 525 formed by depressions in parts 512 and 514 of mold 500 containing a a portion of lead frame 416 and semiconductor device 530 with the required connecting wires. The other lead frames 412, 413, and 417 have similar cavities and are supplied with plastic through runners in a similar manner. It is possible to supply only one cavity with one runner utilizing the present invention. The term 'flash over' as utilized herein refers to a discontinuity in the path of the flow of the plastic which could allow the plastic to enter undesirable areas and perhaps leave scrap in the mold after the strip is removed.

It should be noted that utilizing the strip 400 and the mold 500 the upper surface of the strip forms one surface of the mold to force the flow of plastic. It should also be noted that this method of encapsulation insures that the scrap (shown generally at 560) is carried out of the mold by the strip. This insures that the mold is clean for the next strip to be molded. Heat is applied to the mold as discussed above to cure the plastic prior to opening the mold. Curing of the plastic is completed in an oven after removal of the strip from the mold.

Having described the invention in connection with certain specific embodiments thereof, it is to be understood that further modifications may now suggest themselves to those skilled in the art. It is intended to cover all such modifications such as fall within the scope of the appended claims.

What is claimed is:

1. A method of encapsulating semiconductor devices, comprising:
    providing a mold having upper and lower parts, the parts having facing portions cooperating to form a plurality of cavities for receiving the semiconductor devices, the cavities being arranged in at least two adjacent rows, one part of the mold having a plurality of depressions at selected locations between the rows;
    providing a metal strip carrying a plurality of lead frames arranged to correspond to the locations of the cavities in the mold, each lead frame having at least one of the semiconductor devices mounted thereon;
    positioning the metal strip on the mold;
    providing plastic pellets at locations corresponding to the locations of the depressions in the mold in contact with a surface of the metal strip;
    and bringing the upper and lower parts of the mold together to cause the plastic to flow under pressure out of the depressions along the surface of the strip into the cavities to surround the semiconductor devices therein.

2. The method of claim 1 wherein the plastic flows from each depression into four nearby cavities.

3. The method of claim 2 wherein the plastic first flows out of each depression in opposite directions transverse to the rows and then flows parallel to the rows along four paths into the cavities.

4. The method of claim 1 wherein the plastic pellets rest on an upper surface of the metal strip and the depressions are provided in the upper part of the mold.

* * * * *